(12) United States Patent
Mayer et al.

(10) Patent No.: US 6,713,122 B1
(45) Date of Patent: Mar. 30, 2004

(54) METHODS AND APPARATUS FOR AIRFLOW AND HEAT MANAGEMENT IN ELECTROLESS PLATING

(75) Inventors: Steven T. Mayer, Lake Oswego, OR (US); John B. Alexy, West Linn, OR (US); Jingbin Feng, Lake Oswego, OR (US)

(73) Assignee: Novellus Systems, Inc., San Jose, CA (US)

(*) Notice: Subject to any disclaimer, the term of this patent is extended or adjusted under 35 U.S.C. 154(b) by 0 days.

(21) Appl. No.: 10/272,693

(22) Filed: Oct. 15, 2002

Related U.S. Application Data (63) Continuation-in-part of application No. 09/996,425, filed on Nov. 27, 2001.
(60) Provisional application No. 60/346,170, filed on Oct. 19, 2001.

(51) Int. Cl.[7] .......................... B05D 5/12; H01L 21/44; B05C 9/14; B05C 3/02; B08B 3/08
(52) U.S. Cl. ......................... 427/98; 438/678; 118/58; 118/603; 134/28
(58) Field of Search ................. 438/678, 687; 205/187; 427/96, 98, 430.1; 118/52, 58, 64, 400, 416, 429, 501, 600, 610, 602, 603; 134/26, 28, 34

(56) References Cited

U.S. PATENT DOCUMENTS

| | | | |
|---|---|---|---|
| 5,151,168 A | | 9/1992 | Gilton et al. |
| 5,576,052 A | | 11/1996 | Arledge et al. |
| 5,674,787 A | | 10/1997 | Zhao et al. |
| 5,824,599 A | | 10/1998 | Shacham-Diamond et al. |
| 5,891,513 A | | 4/1999 | Dubin et al. |
| 5,913,147 A | | 6/1999 | Dubin et al. |
| 5,938,845 A | * | 8/1999 | Ang ........................... 118/429 |
| 5,969,422 A | | 10/1999 | Ting et al. |
| 5,972,192 A | | 10/1999 | Dubin et al. |
| 6,065,424 A | | 5/2000 | Shacham-Diamond et al. |
| 6,093,453 A | * | 7/2000 | Ang ........................... 427/438 |
| 6,136,707 A | | 10/2000 | Cohen |
| 6,197,181 B1 | | 3/2001 | Chen |

FOREIGN PATENT DOCUMENTS

WO     99/47731     9/1999

OTHER PUBLICATIONS

Andryuschenko et al., "Electroless and Electrolytic Seed Repair Effects on Damascene Feature Fill," Proceedings of International Interconnect Tech. Conf., San Francisco Ca., Jun. 4–6, 2001, pp. 33–35.

Chen et al., "EDC Seed Layer for Inlaid Copper Metallisation," Semiconductor Fabtech—12th Edition, 5 Pages, Jul. 2000.

Ken M. Takahasi, "Electroplating Copper into Resistive Barrier Films," Journal of the Electrochemical Society, 147 (4) 1417–1417 (2000).

T.P. Moffat et al., "Superconformal Electrodeposition of Copper in 500–90 nm Features," Journal of the Electrochemical Society, 147 (12) 4524–4535 (2000).

(List continued on next page.)

*Primary Examiner*—Evan Pert
(74) *Attorney, Agent, or Firm*—Beyer Weaver & Thomas LLP (57) ABSTRACT

Methods and apparatus for reducing heat load and air exposure when using an electroless plating fluid during a plating process, are presented. An electroless plating apparatus, including an electroless plating vessel and recirculation systems, is presented. The electroless plating vessel minimizes air exposure (and thus evaporative cooling and degradation) of the electroless plating fluid while the recirculation systems minimize heat load of the electroless plating fluid.

42 Claims, 8 Drawing Sheets

OTHER PUBLICATIONS

Ritzdorf et al., "Electrochemically Deposited Copper," Conference Proceedings ULSI XV 2000, Materials Research Society, 101–107.

Reid et al., "Optimization of Damascene Feature Fill for Copper Electroplating Process," Shipley Company, IITC 1999, 3 Pages.

Reid et al., "Copper PVD and Electroplating," Solid State Technology, Jul. 2000, www.solid-state.com, 86–103.

Reid et al., "Factors Influencing Fill of IC Features Using Electroplated Copper," Adv Met Conf Proc 1999, MRS 10 Pages, (2000).

Shacham–Diamond et al., "Copper Electroless Deposition Technology for Ultr–Large–Scalc–Integration (ULSI) Metallization," Microelectronic Engineering 33 (1997) 47–58.

Andryuschenko et al., *"Electroless Copper Deposition Method For Preparing Copper Seed Layers"*, Application No.: 09/996,425, Filed: Nov. 27, 2001.

* cited by examiner

METHODS AND APPARATUS FOR AIRFLOW AND HEAT MANAGEMENT IN ELECTROLESS PLATING

CROSS REFERENCE TO RELATED APPLICATIONS

This application is a continuation-in-part claiming priority under 35 USC §120 from U.S. patent application Ser. No. 09/996,425, filed Nov. 27, 2001, titled "Electroless Copper Deposition Method for Preparing Copper Seed Layers", and naming Andryuschenko, et al. as the inventors; it also claims priority under 35 U.S.C. §119(e) from U.S. Provisional Patent Application No. 60/346,170, filed Oct. 19, 2001, titled "HARDWARE FOR ELETROLESS AND ELECTROPLATING OF ULSI DAMASCENE COPPER," and naming Mayer et al. as inventors. Both applications are incorporated herein by reference for all purposes.

FIELD OF THE INVENTION

This invention relates to methods and apparatus for electroless plating on substrates. More specifically, the invention relates to improved methods for controlling heat load and airflow during electroless plating in order to better control bath chemistry and plating uniformity.

BACKGROUND OF THE INVENTION

The Damascene process provides inlaid copper lines in dielectric layers of integrated circuits. The copper lines provide electrical routing (metal interconnects) between circuit elements in the integrated circuit. Damascene copper lines are rapidly replacing traditional aluminum etched lines in high-performance integrated circuitry.

Currently, a preferred method of metal-interconnect layer deposition is electroplating. This is in part due to the success of "bottom-up" copper filling methods for damascene features. The process typically involves formation of a barrier layer (typically composed of Ta, TiN or TiSiN) and a seed layer (typically copper) over the wafer, followed by plating the wafer to fill embedded structures from the bottom-up. A number of problems occur when trying to accomplish this task. Such problems include: corrosion of the seed layer and associated reactions in the plating bath, poor structures (morphology) of PVD-deposited seed layers, non-uniform deposition of the metal over and into features, and shrinking of feature volume (and associated increase in aspect ratio) when seeded.

As features become smaller, the seed layer must become thinner (otherwise the feature will be closed off by the generally non-conformal PVD seeding process). However, most useful electroplating tool designs require supplying current to the wafer from the wafer's outer edge via the seed layer. When attempting to electroplate using ever thinner seed layers for supplying plating current, the current distribution becomes increasingly dominated by the resistance in the seed layer. This phenomenon is commonly referred to as the "terminal effect."

Thus, the need exists to find methods of depositing seed layers in a more conformal manner. This is because conformal seed layers reduce resistance by providing a greater average thickness in comparison non-conformal layers deposited by PVD, for example. As a result, the terminal effect is mitigated during electroplating.

Electroless plating can provide highly conformal seed layers. And in some cases, electroless plating can replace not only PVD seed deposition, but electroplating as well, thereby dispensing with the need for a plating current and a seed layer. This, of course, circumvents the problems of the terminal effect and poor seed layer step coverage.

There are however problems associated with conventional electroless plating methods and apparatus. Electroless plating baths are typically unstable, undergoing varying degrees of homogeneous and heterogeneous plating (depending on such things as bath composition, purity, and temperature). Additionally, decomposition of electroless plating bath reagents can contaminate the plating process. This decomposition is related to the unstable nature of electroless bath reagents when exposed to heat and air, for example.

The problems of bath instability due to heating are well known. For example, Ang (U.S. Pat. Nos. 6,093,451 and 5,938,845) describe an electroless bath heating apparatus designed to uniformly heat an electroless bath for improved plating uniformity. The problem of bath decomposition onto vessel walls was discussed by Cardin et al. (U.S. Pat. No. 4,674,440). They describe a bath design that allows the introduction of a plating bath poison near the bath wall.

Bath degradation and plating uniformity problems are also described in U.S. Pat. No. 6,065,424 by Shaeham-Diamond et al. They describe a spray electroless apparatus and process. In an early patent by the same authors (U.S. Pat. No. 5,830,805) a single sealed chamber is used to perform a number of electroless deposition spray related steps. In both of these patents, mixing the unstable chemicals just prior to use is said to mitigate instability (point of use mixing). However, problems associated with mixing unstable chemicals and spraying them on a wafer are: 1) high capital cost of precision flow mixing and in line (high rate) heating and control, 2) large volume of expensive chemical used in the spraying process, 3) inability of the thermal capacity of the fluid in the spraying process to rapidly or efficiently heat the wafer (which is initially at ambient temperature) to the electroless plating temperature, and 4) metal, formed from the electroless deposition or sprayed solution on the walls of the chamber, produces numerable sources of in film defects. It is necessary to keep the wafer constantly wet during the spinning and/or spraying process. This requires an excess of plating fluid per wafer that is not recovered, and such methods are therefore wasteful. Also, the wafer itself has a substantial thermal heat capacity. Though the wafer surface is being heated by hot spraying chemical, heat is being removed from the surface and being absorbed by the wafer. The process therefore undergoes a temperature transient that is difficult to control, and slows the overall plating rate and thereby reduces throughput.

Along with heat load on an electroless plating formulation, there is decomposition due to air exposure. This problem has two aspects. First, exposure of electroless plating formulations to air can degrade certain components by oxidation. Second, evaporation of bath components cools the bath and requires additional heating, which can accelerate decomposition. Evaporation is a particular problem because most processes will heat their electroless plating fluids to drive plating reactions. Exposure to air cools the electroless plating fluid, due to evaporation, and thus the fluid needs to be heated above desirable temperatures in order to compensate for the evaporative cooling. This additional heating only speeds up the decomposition pathways.

General process requirements for wafer plating include global and local plating uniformity, defect free process, and high throughput. In order realize high-volume manufacturing (e.g. damascene copper processing) meeting these requirements, electroless plating processes must overcome the bath instability issues. In this respect, electroless bath stability can impact both cost of ownership and defect formation. Therefore methods and apparatus that minimize heat and air exposure to the bath are needed. Methods and hardware design that allow improved bath stability, independent of bath composition, are required.

What is therefore needed are improved apparatus and methods for controlling heat load and airflow to which electroless plating fluids are exposed during electroless plating in order to better control bath chemistry, particularly decomposition pathways, and thereby improve plating uniformity and throughput.

SUMMARY OF THE INVENTION

Methods and apparatus for reducing the heat load and air exposure to an electroless plating fluid during a plating process are presented. An electroless plating apparatus, including an electroless plating vessel and recirculation systems, is presented. The electroless plating vessel minimizes air exposure (and thus evaporative cooling and degradation) of the electroless plating fluid while the recirculation systems minimize heat load of the electroless plating fluid.

One aspect of the invention is an electroless plating apparatus for reducing loss of electroless plating components from an electroless plating fluid used during an electroless plating process and/or reducing the total heat load imparted to the electroless plating fluid. Such apparatus may be characterized by the following features: a heat exchange recirculation loop, the heat exchange recirculation loop including a heat exchanger and a fluid pump, an inlet and an outlet of the heat exchange recirculation loop configured in fluid communication with: an electroless plating vessel recirculation loop, said electroless plating vessel recirculation loop comprising an electroless plating vessel and configured such that the electroless plating fluid enters the electroless plating vessel recirculation loop via the outlet of the heat exchange recirculation loop and exits the electroless plating vessel recirculation loop via the inlet of the heat exchange recirculation loop; a flow meter configured to measure the flow rate of the electroless plating fluid in the electroless plating vessel recirculation loop; and a flow controller configured to receive flow data input from the flow meter and adjust the amount of the electroless plating fluid that flows through each of the heat exchange recirculation loop and the electroless plating vessel recirculation loop. Preferably the flow controller is configured to maintain the volumetric flow velocity within the heat exchange recirculation loop at a greater value than the volumetric flow velocity within the electroless plating vessel recirculation loop during the electroless plating process. Also preferably, the fluid pump is a fixed-speed centrifugal pump. Heat exchangers of the invention may include one or more heater elements in which the liquid being heated circulates around, and/or travels through the heat transfer element. The heat exchange mechanism may take various forms, such as resistive element heaters, and/or radiating elements like quarts lamps, or a liquid heat exchanger with vapor, liquid or air used as the heat transfer means.

Preferably, the electroless plating vessel includes: a bubble separation chamber, configured to prevent bubbles from entering the plating chamber during the electroless plating process; an airflow control device, configured to modulate exposure of the electroless plating fluid to air during the electroless plating process; and a ballast tank, configured to receive the electroless plating fluid from a plating chamber of the electroless plating vessel and return the electroless plating fluid to the heat exchange recirculation loop. Preferably the electroless plating vessel further includes a fluid flow diffuser configured to create a uniform laminar flow of the electroless plating fluid which impinging upon a substantially planar work surface of a workpiece during the electroless plating process.

Also preferably the electroless plating cell further includes a rinse return duct, configured to receive rinsate from the workpiece during rinse operations. The rinse return duct may also serve as an airflow exhaust port. In a preferred embodiment, the rinse return duct feeds rinsate and exhaust air into an air and rinsate drain manifold configured to feed air and rinsate into separate waste streams. In another preferred embodiment, the rinse return duct further includes an airflow exhaust control distributor configured to maintain a substantially even flow distribution in the total airflow within the electroless plating vessel during the electroless plating process.

Preferably the airflow control device is an airflow confinement ring attached to a wafer holder used to plate wafers in the electroless plating vessel. The airflow confinement ring, when positioned within the plating cell, creates an airflow channel (in conjunction with the inner walls of the plating vessel for example) through which airflow passes. Preferably the wafer holder is a clamshell wafer holder. Preferably the airflow confinement ring is configured to minimize the amount of air to pass over the electroless plating fluid during any stage of the electroless plating process, while still containing any vapors that may be produced by the liquid.

Preferably the ballast tank includes a fluid return slide configured to allow the electroless plating fluid to enter the ballast tank along a slope and thereby minimize agitation of the electroless plating fluid during return to the ballast tank.

Another aspect of the invention is the electroless plating vessel as described above, and below in relation to the figures which show an exemplary electroless plating vessel.

Yet another aspect of the invention is a method of reducing the total head load of an electroless plating fluid during a plating process. Such methods may be characterized by the following aspects: circulating the electroless plating fluid through a heat exchange recirculation loop at a first volumetric flow velocity, the heat exchange recirculation loop including a heat exchanger and a fluid pump, an inlet and an outlet of the heat exchange recirculation loop configured in fluid communication with an electroless plating vessel recirculation loop; and circulating the electroless plating fluid through the electroless plating vessel recirculation loop at a second volumetric flow velocity, the electroless plating vessel recirculation loop including an electroless plating vessel and configured such that the electroless plating fluid enters the electroless plating vessel recirculation loop via the outlet of the heat exchange recirculation loop and exits the electroless plating vessel recirculation loop via the inlet of the heat exchange recirculation loop. In such methods, preferably the first volumetric flow velocity is greater than the second volumetric flow velocity. Preferably the first volumetric flow velocity is between about 2 lpm and 12 lpm, and the second volumetric flow velocity is between about 0.5 lpm and 6 lpm. Preferably such methods further include controlling the amount of evaporation of the electroless plating fluid during plating. One preferred method of controlling evaporation is by minimizing the airflow to which the electroless plating fluid in the electroless plating vessel is exposed. One preferred method of minimizing the airflow to which the electroless plating fluid is exposed includes use of an airflow confinement ring attached to a wafer holder and configured to provide, in conjunction with an inner surface of the electroless plating vessel, a peripheral air channel through which air flows during the plating process.

Yet another aspect of the invention is a method of removing metal deposits from surfaces of a wafer plating apparatus. Such methods are particularly useful for electroless plating applications, especially those carried out in apparatus such as described above and in relation to the figures below. Such methods may be characterized by the following aspects: removing a plating solution from the wafer plating apparatus; providing an inorganic acidic medium to the wafer plating apparatus; providing an oxidizing medium to the wafer plating apparatus; circulating the inorganic acidic medium and the oxidizing medium through the wafer plating apparatus; and removing the inorganic acidic medium and the oxidizing medium from the wafer plating apparatus.

Preferably the acidic medium includes at least one of sulfuric acid, hydrochloric acid, nitric acid, phosphomolybdic acid, perchloric acid, and mixtures thereof. Preferably the oxidizing medium includes at least one of hydrogen peroxide, potassium permanganate, chromate salts, ozone, perchlorate salts, and mixtures thereof. Other acids and oxidizing agent can also be used as known by those skilled in the art. In a particularly preferred embodiment, the inorganic acid includes between about 1 and 5 weight percent sulfuric acid, and the oxidizing medium includes between about 1 and 5 weight percent of aqueous hydrogen peroxide. Also preferably such methods further include rinsing the wafer plating apparatus with deionized water after removing the inorganic acidic medium and the oxidizing medium from the wafer plating apparatus.

These and other features and advantages of the present invention will be described in more detail below with reference to the associated drawings.

DETAILED DESCRIPTION OF PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In some descriptions herein, well-known processes, procedures, and components have not been described in detail so as not to unnecessarily obscure aspects of the present invention.

In this application, the term "wafer" is used extensively. The term "wafer" generally refers to a semiconductor wafer as such wafer exists during any of many stages of integrated circuit fabrication thereon. The discussion herein focuses on electroless plating operations on wafers. The invention is not limited to wafer plating however.

As mentioned above, methods and apparatus for are presented for reducing the heat load and air exposure to an electroless plating fluid during a plating process. An electroless plating apparatus, including an electroless plating vessel and recirculation systems, is presented. The electroless plating vessel minimizes air exposure (and thus evaporative cooling and degradation) of the electroless plating fluid while the recirculation and heating systems minimize heat load of the electroless plating fluid.

Heat loss through the cell and circulation loop tubing walls and through bath evaporation (coupled through the air flow rate and pattern) can effect the performance of an electroless cell. In order to maintain preferred operating temperatures, heat losses must be compensated for by excess heating of the plating fluid. Preferably apparatus of the invention have insulated bath and circulation systems to minimize heat loss and thus minimize heating the plating fluid to compensate for such heat loss. Additionally, the invention focuses on minimization of evaporative cooling of the plating fluid and minimization of the total heat load imparted to the plating fluid during plating operations.

Typical electroless plating baths operate at 55–90° C. The heat load can be approximated by the simplifed relationship:

$$Q_L = A_c H_c \Delta T_c + A_t H_t \Delta T_t + E(f) \Delta H_{vap}$$

Where $Q_L$ is the heat load (watts), A is an interfacial area between the hot solution and the ambient environment, H is an average heat transfer coefficient, $\Delta T$ is the temperature difference between the solution and the ambient air, E(f) is the evaporation rate (cc/sec) of the bath (which is a function of air flow rate and pattern, f), $\Delta H_{vap}$ is the heat of vaporization of water (J/cc). The subscripts c and t stand for the cell and the circulation loop tubes, etc. Insulation effectively decreases the heat transfer coefficient, reducing the heat load. By reducing the cooling convective flow, and partially saturated air over the bath, the evaporation rate can be substantially decreased.

Heat lost through the above-identified sources must be replaced by passing the bath through or over a heat exchanger to maintain the bath at the desired operating temperature. A simplifed expression for the rate of heating is:

$$Q_s = A_{he} H_{he}(T_{interface} - T_{he}) = F C_p (T_{out} - T_{bath})$$

In the above equation, $Q_s$ is the heat supplied from the heating device (heat exchanger). In the steady state it is equal to the heat lost to the environment ($Q_s = Q_L$). $T_{interface}$ is the temperature of the bath at the heat exchanger interface, and $T_{he}$ is the temperature of the heat exchanger (e.g. heat exchanger fluid). Therefore, ($T_{interface} - T_{he}$) represents the temperature difference between the heat exchanger surface and the bath at the heat exchangers/bath interface (understand that this represents average values over the exchanger). Typically the inlet temperature of the fluid to the exchanger is equal to the bath temperature (therefore we have used the symbol $T_{bath}$). The bath fluid must be heated above the bath temperature (to $T_{out}$) for heat to be supplied to the bath. Therefore the last portion of the above expression is a heat balance over the exchanger. In the above expression, F is the flow rate (cm³/sec) of fluid through the exchanger, and $C_p$ is the heat capacity of the bath (J/cm³/° C.). $T_{interface}$ is the highest bath fluid temperature in the apparatus, and therefore largely determines the stability of the plating apparatus as a whole (i.e. auto-decomposition will occur most rapidly there).

Based on the above, in order to reduce the autocatalytic degradation processes, apparatus that minimize $T_{interface}$ are favored. A lower heat load ($Q_l$) will lower the heat demand ($Q_s$) and can be reduced by minimizing the evaporation rate (through efficient airflow) and using appropriate insulation. For a fixed heat load, $T_{interface}$ (and $T_{out}$) are reduced by using a larger recirculating flow rate (larger F). Larger recirculation flow rate will also increase the value of the heat transfer coefficent the exchanger ($H_{he}$). However, excess recirculation can have some adverse impact the plating processes (e.g. uniformity, bubble generation, etc.) so a value of 4–10 lpm is preferred.

Given the above discussion, the invention will first be described in terms of some exemplary hardware embodiments, to provide context for description of methods of the invention described thereafter.

Figure 1:
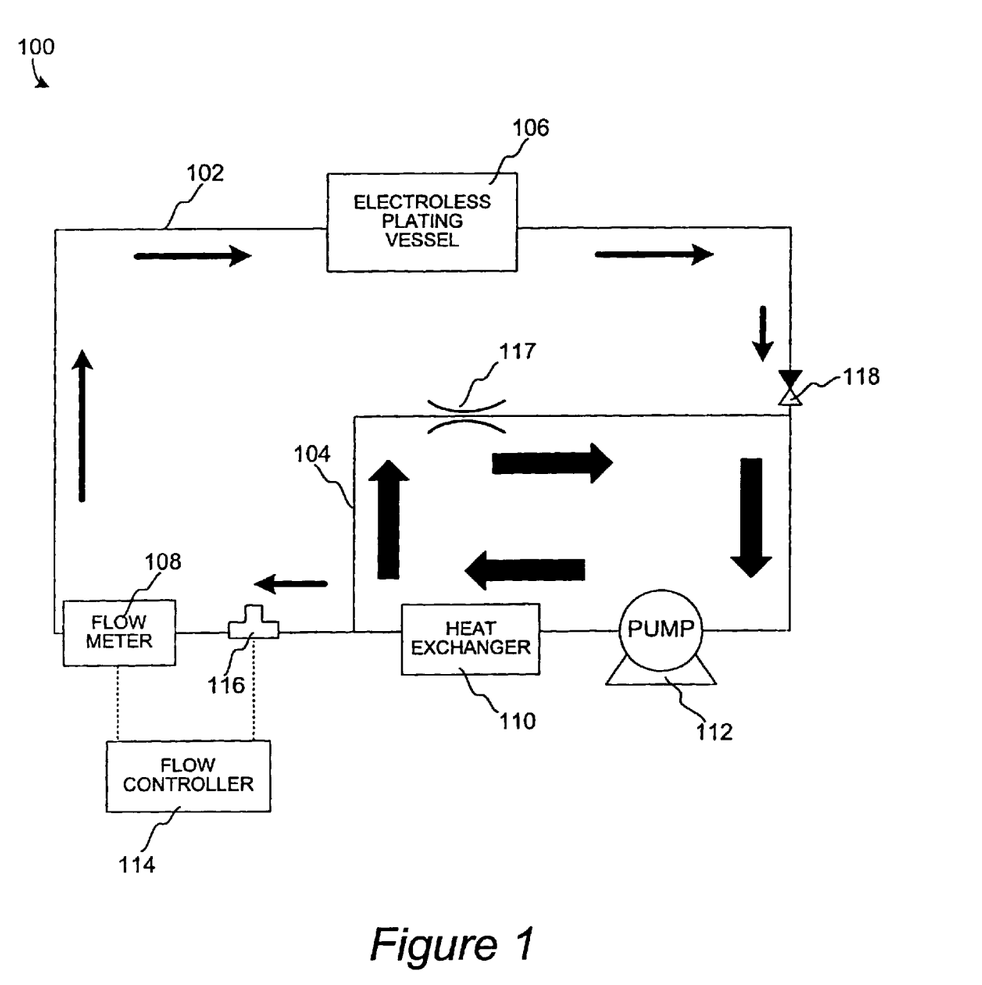
FIG. 1 is a simplified block diagram of an electroless plating apparatus in accordance with the invention.

FIG. 1 is a simplified block diagram of an electroless plating apparatus, 100, for reducing the total heat load imparted to a plating fluid during plating in accordance with the invention. Apparatus 100 includes two recirculation loops, an electroless plating vessel recirculation loop 102 and a heat exchange recirculation loop 104. Heat exchange recirculation loop 104 includes heat exchanger 110 and pump 112. Plating fluid flows through loop 104 at a first fluid flow velocity, as indicated by the heavy arrows. The first flow velocity is greater than a second flow velocity (indicated by the thinner arrows) within the plating vessel recirculation loop. A flow meter 108 measures the second flow velocity, within loop 102. Thus during plating, the plating fluid is heated within loop 104, and is recirculated through loop 104 at a flow velocity greater than that used in loop 102, which contains the plating vessel. Thermal stress to the plating fluid is minimized by maximizing convection (high flow rate) in heat exchanger 110. High heat exchange rates also minimize the propensity for autocatalytic decomposition and electroless plating onto an unnecessarily hot heat exchanger surface.

While the flow velocity within heat exchange loop 104 is relatively high (e.g. a fixed-speed centrifugal pump, 112, is used), the flow velocity within the plating vessel circulation loop 102 is maintained at a level optimum for plating, preferably between about 4 and 10 lpm. This is preferably performed using a feedback control mechanism. Flow controller 114 receives flow data from loop 102 via flow meter 108. Flow controller 114 uses this flow data to adjust the amount of plating fluid that enters flow loop 102 from loop 104, via valve 116. Since the flow rate within loop 104 is greater than that within loop 102, a one-way valve, 118, may be used at the inlet of loop 104 to ensure that no back flow occurs into plating vessel 106. Note that flow restrictor 117 may be employed in heat exchanger loop 104. It functions increase the flow resistance to loop 104 to compensate for various resistances in loop 102, such as filters and restrictive mechanisms associated with plating vessel 106. Without restrictor 117, flow controller 114 might not be able to maintain the desired relative volumetric flows in the two loops.

Heat exchanger 101 may be any suitable mechanism for transferring heat energy to the plating fluid. In one example, it is a resistive element heater, where the plating fluid flows around and/or between the heater element for heat transfer to the plating fluid. In another example, it is a radiant heater, (e.g., a quartz lamp) where the plating fluid flows around and/or between the heater element for heat transfer to the plating fluid. In yet another example, it comprises separate channels, where a heat transfer vapor or liquid or gas is heated and passed through the separate channels for the heat transfer to the plating fluid.

Electroless plating apparatus such as that described in relation to FIG. 1 allow significant reduction of heat load imparted to a plating fluid during plating. As mentioned, another aspect of the invention is an electroless plating vessel that includes mechanisms for reducing evaporative cooling of plating bath fluid during plating operations, and thus heat load to the plating fluid, vida supra. Additionally, electroless plating vessels of the invention reduce bubble formation (and thus plating defects), reduce total amount of plating fluid required, and have a reduced footprint relative to conventional electroless apparatus.

Figure 2:
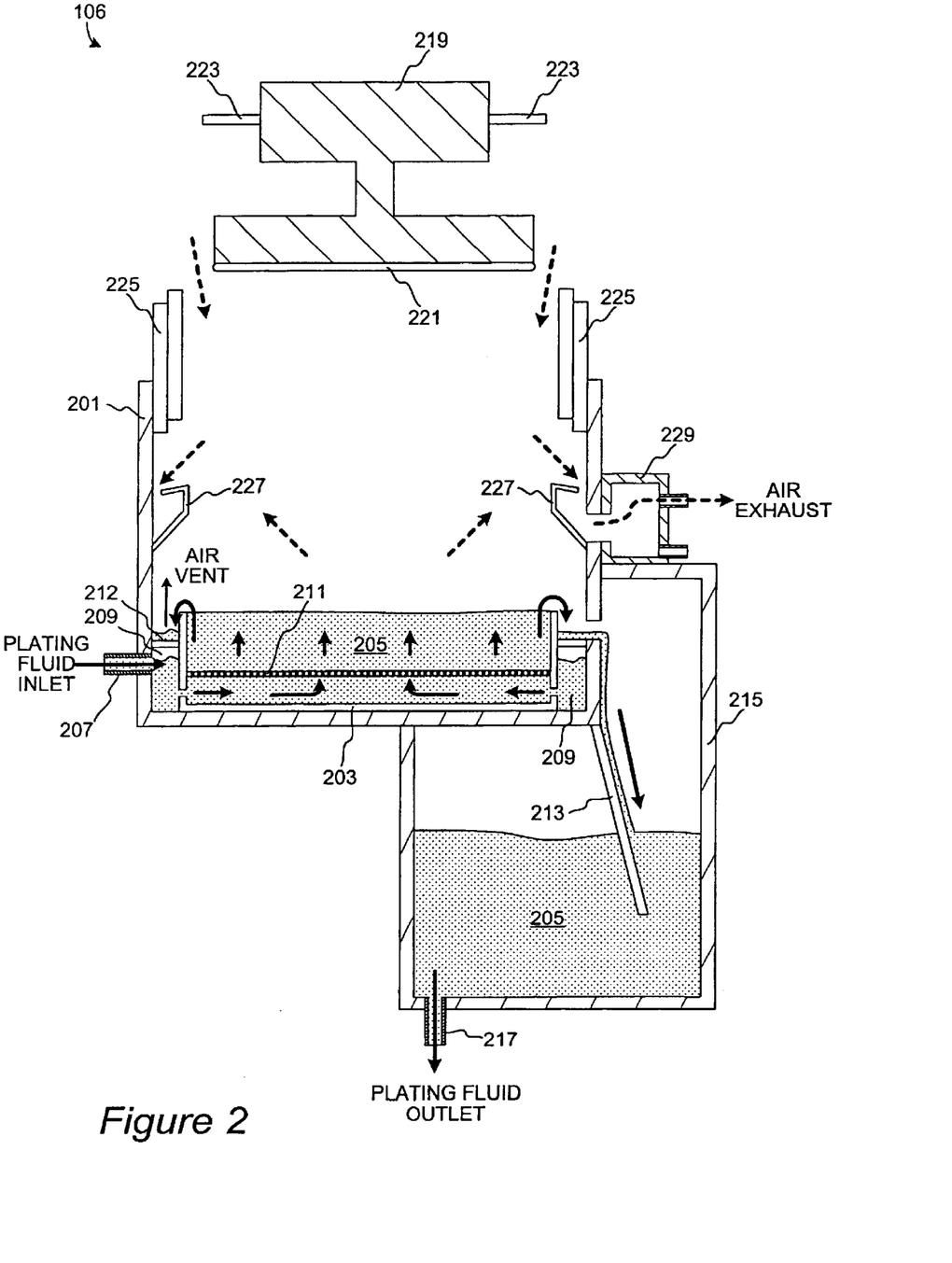
FIG. 2 is a cross section of an exemplary electroless plating vessel in accordance with the invention.
Figure 3:
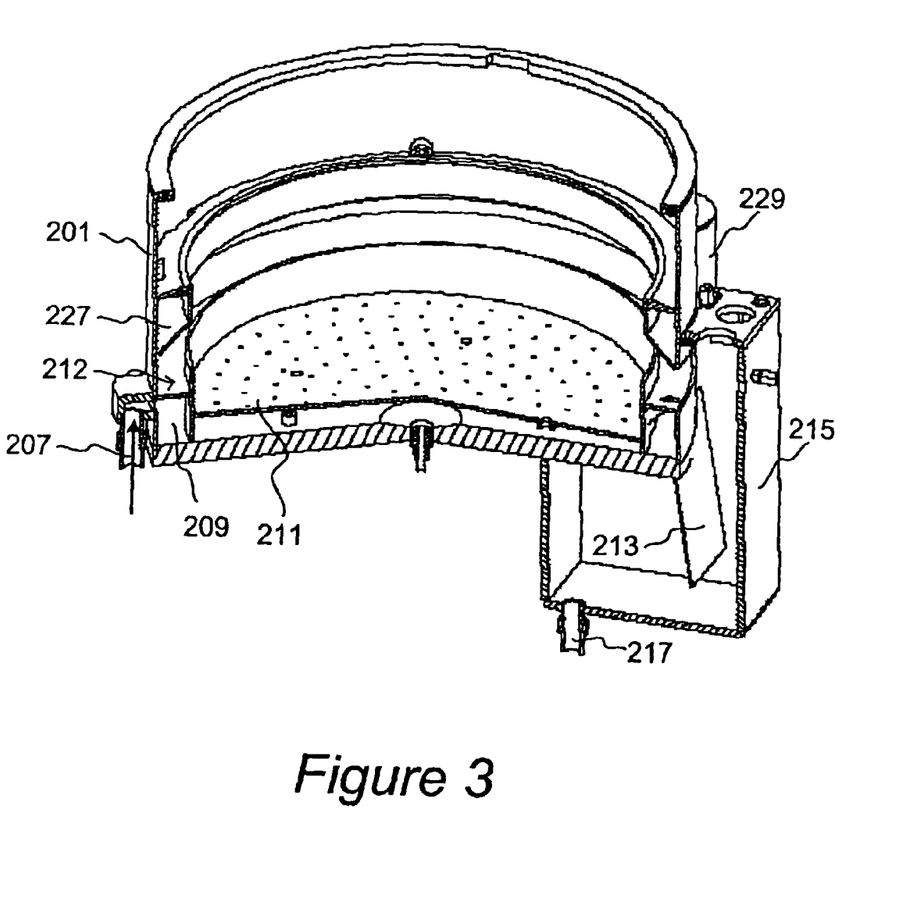
FIG. 3 is a perspective of an exemplary electroless plating vessel of the invention.

FIG. 2 is a simplified cross section showing more detail of electroless plating vessel 106 (as depicted in FIG. 1). Solid arrows in FIG. 2 depict fluid flow patterns and dashed arrows depict airflow patterns. A wafer holder 219 is depicted in a position for loading a wafer 221. FIG. 3 shows a cross sectional perspective of an actual electroless plating vessel (reference numbers indicate the same components in FIGS. 2 and 3). Referring to FIG. 2, electroless plating vessel 106 has a main vessel, 201, in which is located a plating cell, 203. Plating cell 203 holds electroless plating fluid 205. Plating fluid 205 enters main vessel 201 via fluid inlet 207. The plating fluid first enters a bubble separation chamber 209. In this example, bubble separation chamber 209 is a ring-shaped chamber at the bottom of vessel 201 and around plating cell 203. Plating fluid is directed, via inlet, upward and into bubble separation chamber 209. Plating fluid enters plating cell 203 via apertures proximate to the bottom of the cell. In this way, bubbles in plating fluid 205 are given ample opportunity to rise to the top of chamber 209 and can be vented. In a preferred embodiment, at the highest point of the bubble separation chamber is a bleed aperture, that allows gas to be released (and diverts a small amount of flow directly back into a ballast chamber 215 (thereby avoiding introducing bubbles into the plating chamber).

Once plating fluid enters plating cell 203 it passes through a diffuser membrane, 211. Diffuser membrane, 211, is included for helping to provide a uniform laminar flow (via a differential pressure established on either side of the diffuser membrane) of the plating fluid that impinges on the wafer. The diffuser membrane is located proximate the bottom of the cell. The immersed wafer is typically located about 1 to 4 inches above the diffuser. The diffuser establishes a sufficiently large flow resistance (typically ~2–5 psi at a flow rate of 75 ml/cm2) such that a uniform upwards flow of electrolyte at the wafer is achieved. The diffuser membrane (or plate) consists of a porous media, or a solid media with a large number of small flow holes drilled into it. The key parameters are that the spacing of the holes (or pores) is much smaller than the gap between the wafer the diffuser plate. The diffuser plate can be tilted to allow any bubbles to ride up the sloped surface. It can have a small gap around its edge, or a hole through which bubbles can escape from underneath the plate but not be directed at the wafer surface. A detailed description of such membranes is given in U.S. patent application Ser. No. 09/927,740, naming Reid et al., filed Aug. 10, 2001, entitled, "Methods and Apparatus for Controlling Electrolyte Flow for Uniform Plating," which is herein incorporated by reference for all purposes.

Plating fluid 205 passes from plating cell 203 over its outermost edge (which acts as a level control weir). As mentioned, to minimize defect formation, it is desirable to eliminate/minimize the formation of bubbles in the circulation process. Therefore, fluid that flows over the weir is collected in a relatively narrow circumferential overflow collection trough, 212. The vertical drop from the weir (top edge of cell 203) to collection trough 212 is kept small (preferably about 1 inch or less) thereby minimizing agitation. Because of the relatively large area for flow, the velocity of flow over the wall is small, creating little turbulence and few bubbles. This weir controls the fluid height/level with respect to the cell and wafer positioning apparatus. In some preferred embodiments, the weir has a section with a slot removed at the location closest to the ballast chamber. This slot tends to increase flow though that region and causes there to be a general flow of surface fluid (and any associated bubbles) directed toward that slot exit in a controlled fashion (note the air vent depicted in FIG. 2), eliminating the possibility of there being a surface flow eddy and a stagnant area where bubbles can accumulate.

Collection trough 212 directs the fluid flow to a collection vessel, ballast chamber 215. Fluid level, in the ballast chamber, is controlled by level sensors (not shown). Fluid flows into the ballast chamber in a controlled fashion, down sloped return slide 213, to prevent unnecessary formation of bubbles. Plating fluid exits ballast chamber 215 via fluid outlet 217, and returns to the recirculation loops as described in relation to FIG. 1. Fluid outlet 217 is located proximate the bottom of ballast chamber 215 and as far as possible from where the return slide delivers recirculating fluid to the surface of the fluid held in the ballast chamber. In this way, ballast chamber 215 also serves as a bubble settling tank, and thus helps to keep bubbles from entering the recirculation loops as described in relation to FIG. 1. Other methods of eliminating existing bubbles, their formation, and minimizing the propensity of defects associated with bubbles can be found in U.S. Patent application Ser. No. 09/872,340; titled "METHODS AND APPARATUS FOR BUBBLE REMOVAL IN WAFER WET PROCESSING," by Patton, et al. and filed on May 31, 2001, which is herein incorporated by reference for all purposes. Preferably, the ballast chamber volume is sufficient to contain plating overflow liquid produced when the wafer holder is placed into the plating cell, while at the same time minimizing volume, and surface area of the ballast tank.

As mentioned, wafer holder 219 is depicted in a wafer loading position in FIG. 2 (wafer holder not shown in FIG. 3). Wafer holder 219 is shown holding a wafer 221. An exemplary wafer holder 219 is the Clamshell apparatus available from Novellus Systems, Inc. of San Jose, Calif. A detailed description of the clamshell wafer holder is provided in U.S. patent application Ser. No. 09/927,741, naming Mayer et al., filed Aug. 10, 2001, entitled, "Improved Clamshell Apparatus for Electrochemically Treating Wafers," which is herein incorporated by reference for all purposes. Included with wafer holder 219 is an airflow confinement ring, 223. As depicted by the dashed arrows, when wafer holder 219 is in the "load" position, air passes between the airflow confinement ring and a splash control mechanism 225. Splash control mechanism 225 includes slidably coupled concentric rings, which in FIG. 2 are shown in the contracted position (to allow horizontal insertion of wafer 221 into wafer holder 219). Air passing into main vessel 201 exits via a rinse (and air exhaust) return duct, 227. Return duct 227 (see also FIG. 3) is a ring-shaped trough that has an aperture (or apertures) on its top surface (in this case the top surface is also angled to direct fluid flow to its outermost edge). Air (and vapors from fluid 205) enter duct 227 at the aperture and exit via an air and rinsate drain manifold, 229. In FIG. 2, only airflow through manifold 229 is depicted.

The flow of exhaust air is important during electroless plating operations. This is largely associated with the use of volatile organic compounds (e.g. formaldehyde) and operations at higher temperatures (thus creating vapors). A minimum amount of exhaust is required and a minimization of evaporation of the plating fluid is desirable so as to minimize the heat load on the cell. Because the heating load is directly linked to the amount of evaporation, and the heat load can add undo stress to the bath (in the form of unnecessarily high temperature differences across the heat exchanger), efficient design of airflow is a must.

Preferably rinse return duct 227 further includes an airflow exhaust control distributor configured to maintain a substantially even flow distribution in the total airflow within the electroless plating vessel during the electroless plating process. The airflow slot sizes in the airflow control distributor increase around the periphery as the distance from the air and rinse water return manifold increases (see FIG. 3). This results in a substantially azimuthally uniform downward airflow around the outer periphery of vessel 203.

Figure 4:
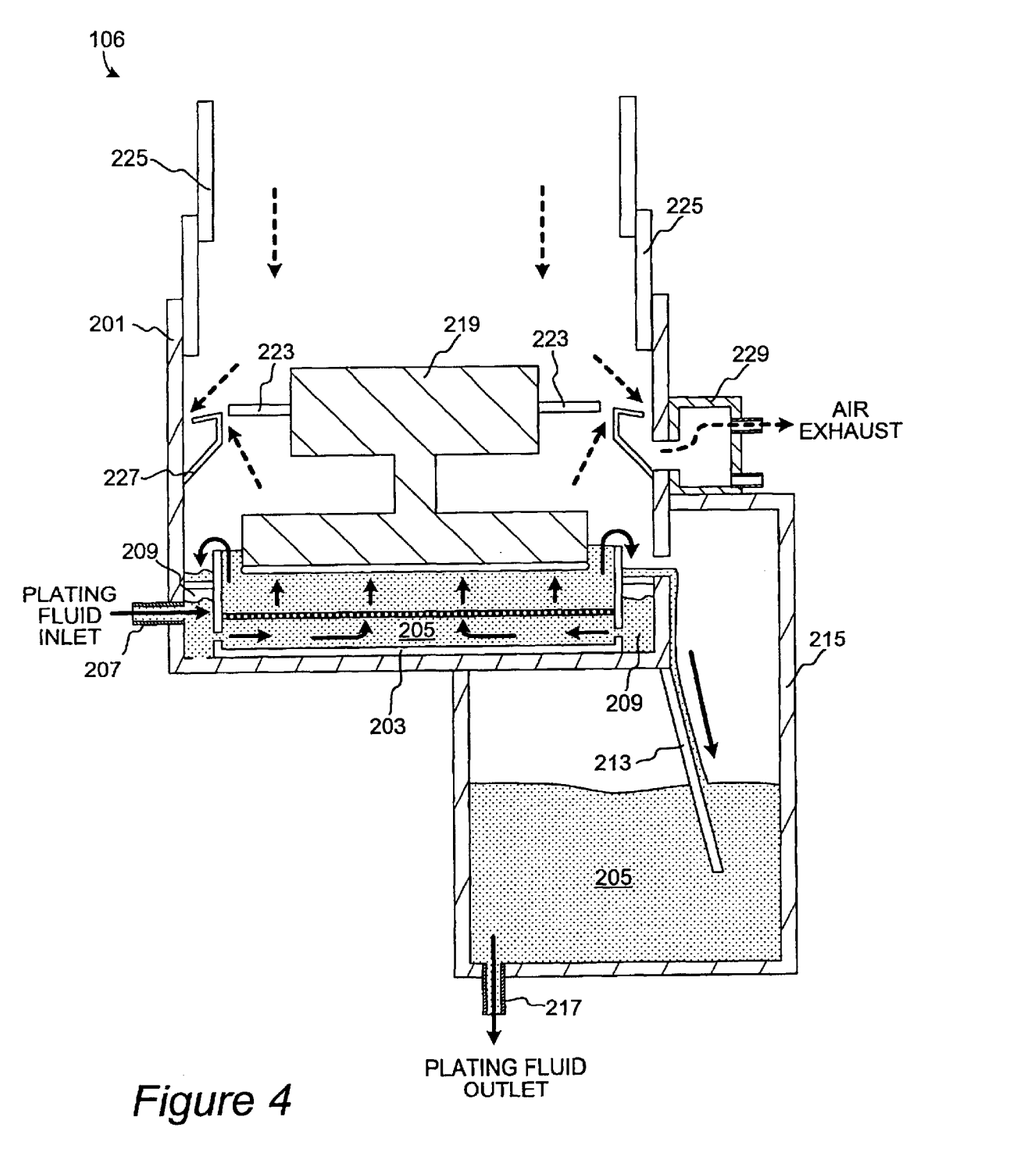
FIGS. 4–6 are cross sections as in FIG. 2, but showing various modes of operation of the electroless plating vessel during plating process operations.
Figure 5:
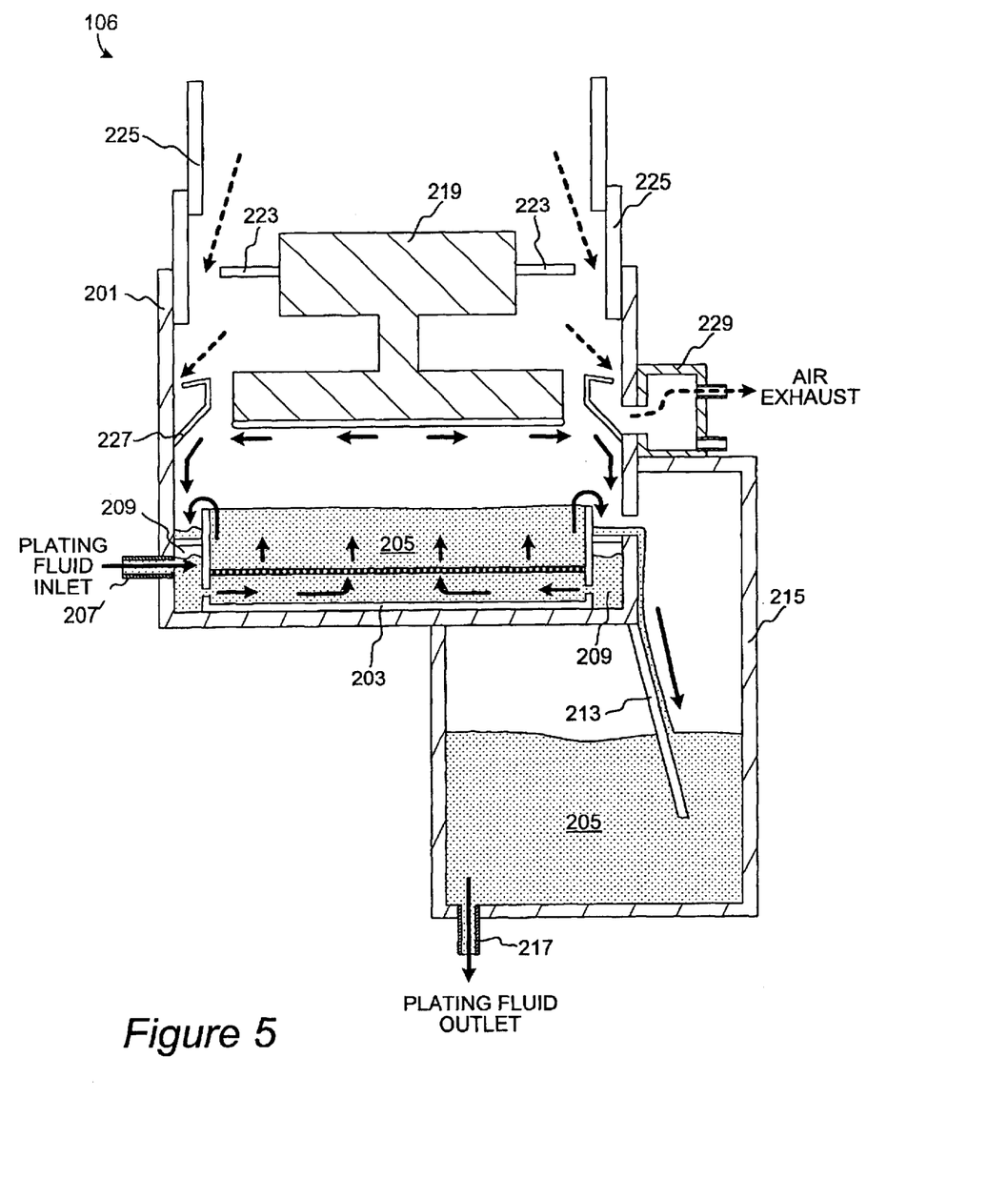
Figure 6:
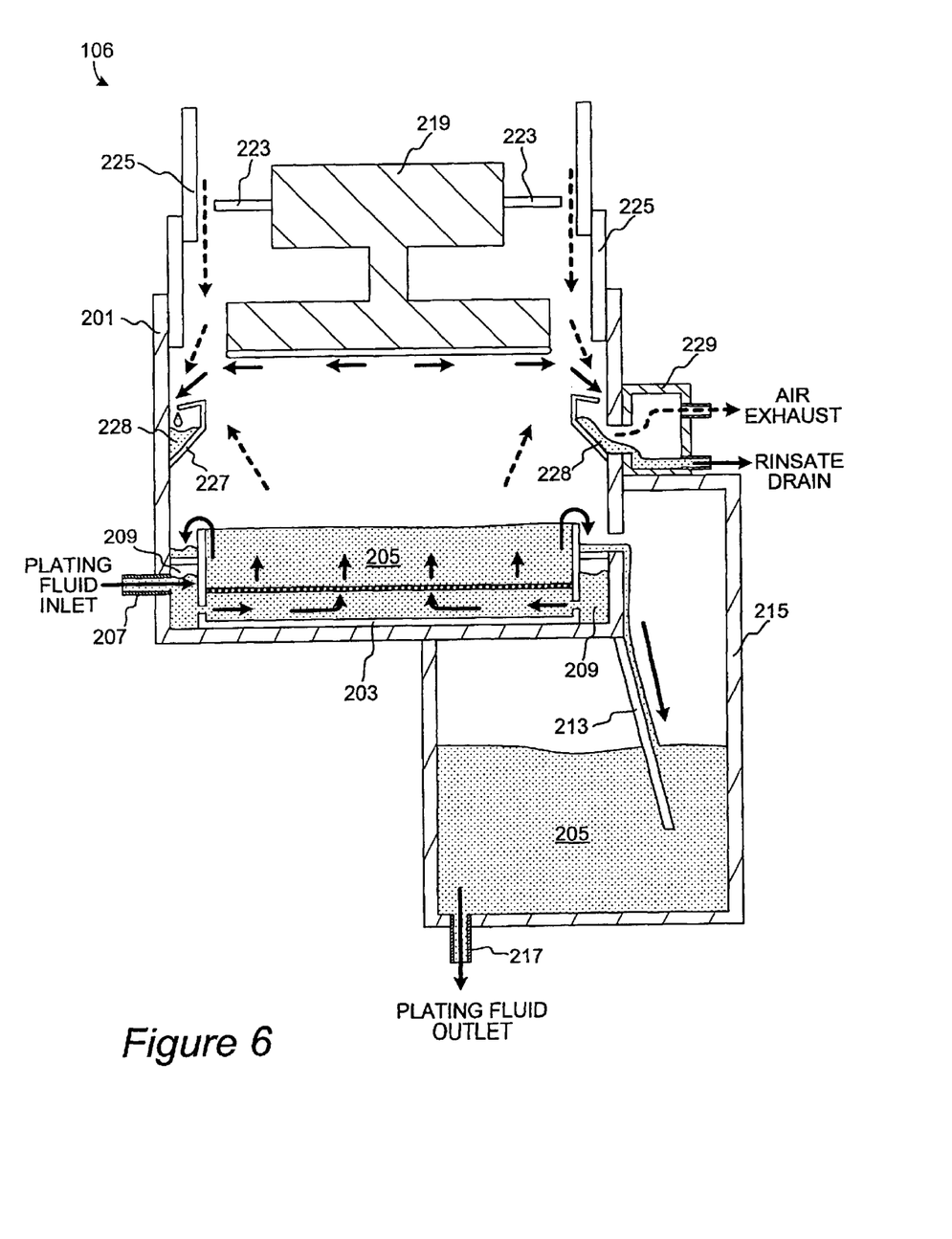

As mentioned, FIG. 2 depicts wafer holder 219 in the "wafer load" position, relative to electroless plating vessel 106. FIGS. 4–6 depict wafer holder 219 in "plating," "reclaim," and "rinse" positions, respectively. The air and fluid flow through vessel 106 for each of these positions will be described in relation to each of FIGS. 4–6. For consistency, reference numbers are the same as in FIGS. 2 and 3.

Referring to FIG. 4, when plating the wafer is immersed in electroless plating fluid 205 within plating cell 203. As described above, the plating fluid that is displaced by the wafer and wafer holder passes over the weir and into collection trough 212, etc. FIG. 4 shows how the air flows through a controlled gap created by the airflow confinement ring, mounted on the outside of the clamshell rotating motor and assembly. In this configuration, evaporation of water and bath volatiles is relatively small because the wafer and clamshell cover most of the surface of fluid 205 within plating cell 203. Preferably the airflow confinement ring is configured to allow a minimum amount of air to pass over the electroless plating fluid while containing vapors from the plating fluid, during any stage of the electroless plating process. Thus combination of a small air gap and minimal fluid surface exposure during plating minimize evaporation and thus cooling and degradation via oxidation (and excess heat load, vida supra). In a particularly preferred embodiment, an inert gas may be passed through the air gap in lieu of air to minimize oxidative degradation of electroless plating fluid components. Note that the slidably-coupled concentric rings of the splash control mechanism 225 are shown in the extended position (relative to FIG. 2). This serves to control any plating fluid from splashing out of vessel 201.

Referring to FIG. 5, wafer holder 219 is in the "reclaim" position. That is, after plating, the wafer holder rotation is stopped or substantially slowed. Then the wafer holder is raised to the reclaim position as shown. The wafer holder is then rotated again at a speed sufficient to propel the plating fluid thereon onto a sloped outer surface of rinse return duct 227, as depicted by the arrows in FIG. 5. The plating fluid runs down the outside of the duct, onto an inner wall of vessel 201, and into collection trough 212. Downward and outward airflow is maintained by the gap between confinement ring 223 and the lower ring of the splash control mechanism. In this phase of the operation, a high surface area of hot volatile liquids is created, and therefore proper vapor control is essential. Air flows up through the gap between wafer holder 219 and the inner wall of vessel 201, and into return duct 227.

Referring to FIG. 6, wafer holder 219 is in the "rinse" position. That is, after reclaim of plating fluid, the wafer holder is raised to the rinse position. The wafer holder is rotated and rinsed with preferably deionized water. The rinsate, 228, is spun off the wafer holder and onto the inner wall of vessel 201. Then it flows down the inner wall and into rinse return duct 227. From there is enters exhaust manifold 229. Preferably rinsate drain manifold 229 is configured to feed air and rinsate into separate waste streams. As mentioned, the rinse return duct further includes an airflow exhaust control distributor configured to maintain a substantially even flow distribution in the total airflow within the electroless plating vessel during the electroless plating process. The airflow slots (refer to FIG. 3) are designed to serve also as rinsate return apertures. In the rinse position, downward and outward airflow is maintained by the gap between confinement ring 223 and the upper ring of the splash control mechanism.

Figure 7:
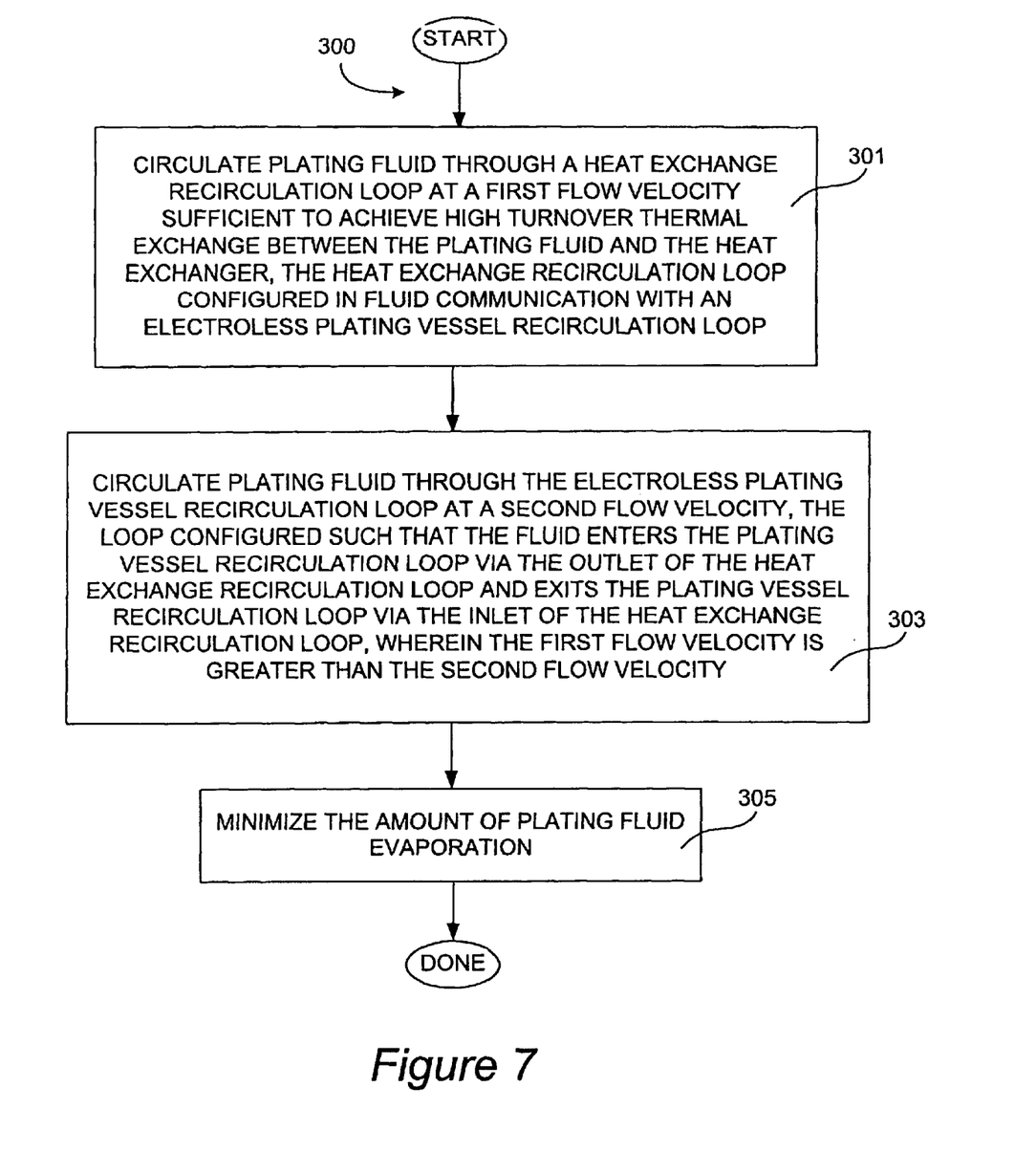
FIG. 7 is a flow diagram depicting aspects of a method of reducing the total heatload imparted to an electroless plating fluid during electroless plating operations in accordance with the invention.

The apparatus as described above may be used to implement methods of the invention. FIG. 7 depicts aspects of a process flow, 300, in accordance with the invention (refer also to FIG. 1). An electroless plating fluid is circulated through a heat exchange recirculation loop at a first volumetric flow velocity, the heat exchange recirculation loop including a heat exchanger and a fluid pump, an inlet and an outlet of the heat exchange recirculation loop configured in fluid communication with an electroless plating vessel recirculation loop. See 301. The electroless plating fluid is concurrently circulated through the electroless plating vessel recirculation loop at a second volumetric flow velocity, the electroless plating vessel recirculation loop including an electroless plating vessel and configured such that the electroless plating fluid enters the electroless plating vessel recirculation loop via the outlet of the heat exchange recirculation loop and exits the electroless plating vessel recirculation loop via the inlet of the heat exchange recirculation loop. Preferably the first volumetric flow velocity is greater than the second volumetric flow velocity. See 303. Preferably the first volumetric flow velocity is between about 2 lpm and 12 lpm, and the second volumetric flow velocity is between about 0.5 lpm and 6 lpm. Lower flow rates are generally better, but the impact on the electroless plating itself must be considered.

Concurrently with 301 and 303, the amount of evaporation of the plating fluid is minimized. See 305. Preferably this is done by minimizing the airflow to which the electroless plating fluid in the electroless plating vessel is exposed. As described in relation to FIGS. 4–6, preferably minimizing the airflow to which the electroless plating fluid is exposed includes use of an airflow confinement ring, said airflow confinement ring attached to a wafer holder and configured to provide, in conjunction with an inner surface of the electroless plating vessel, a peripheral air channel through which air flows during the plating process. Then the method is completed.

As mentioned, another aspect of the invention is a method of removing metal deposits from surfaces of a wafer plating apparatus. Such methods are particularly useful for electroless plating applications, especially those carried out in apparatus such as described above in relation to the figures. Although precautions may be taken in the design of plating tools to reduce plating of bath metal on various elements (cell walls, heat exchanger, filters, etc.), spurious metal plating can not be completely eliminated. Also, once metal has nucleated on plating apparatus components, the rate of growth will increase rapidly. Therefore, a method for removing spuriously plated metal is described. Methods of the invention used to remove such spurious metal deposits are referred to as "Tool Supercleaning." Preferably such methods are automated, that is, the plating hardware has components that allow automated "tool supercleaning" as a periodic aspect of the overall plating process.

Figure 8:
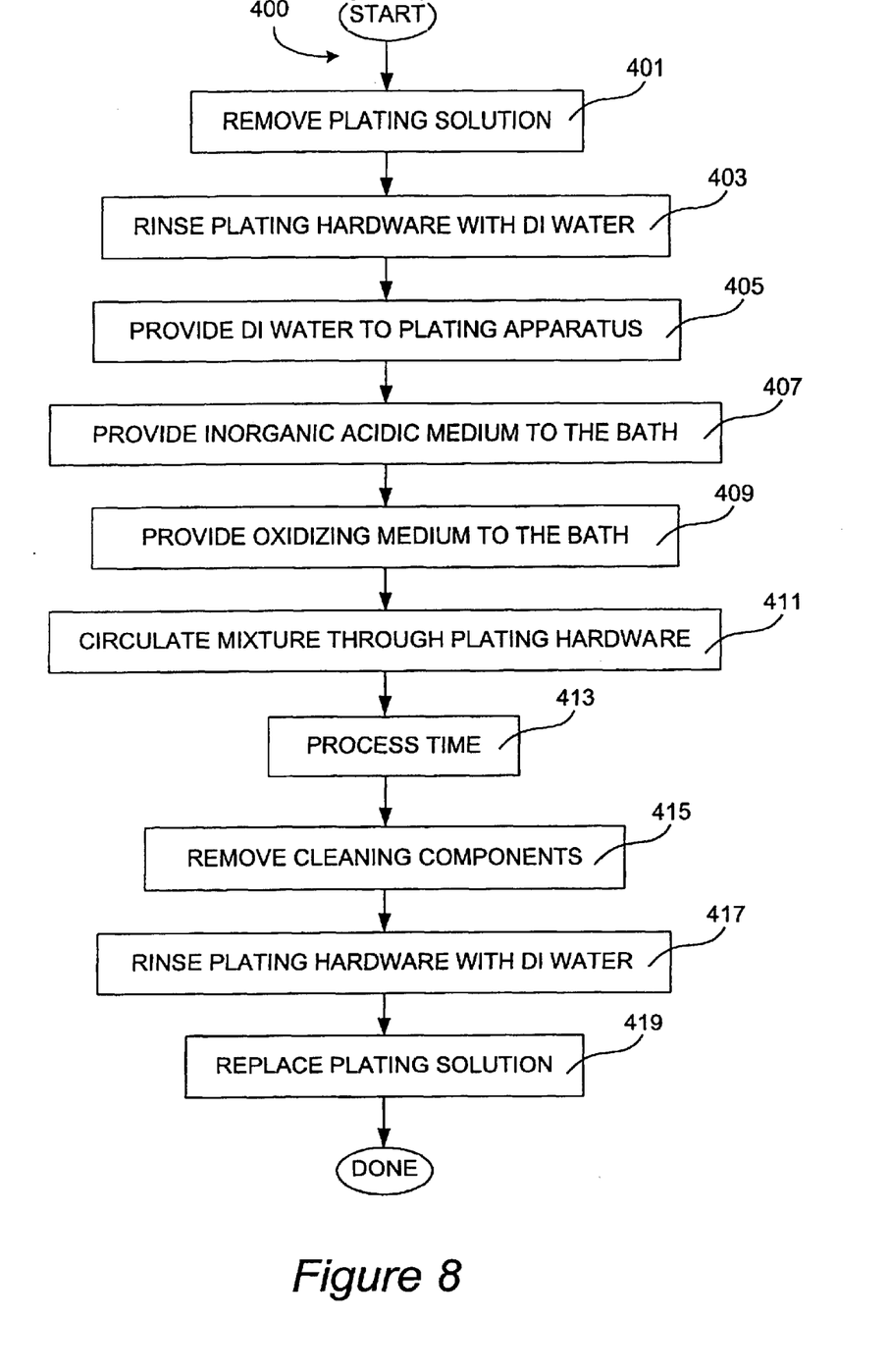
FIG. 8 is a flow diagram depicting aspects of a method of removing spuriously deposited metal contaminants from a plating apparatus such as those described herein.

FIG. 8 depicts aspects of a process flow, 400, in accordance with the invention. Methods of the invention may include more or less steps than depicted in flow 400 without escaping the scope of the invention. First the plating fluid is removed. See 401. Optionally, the plating hardware is rinsed with deionized water. See 403. Such a rinse preferably includes circulating the water through all the components that normally circulate the plating fluid. Preferably, but not necessarily, cleaning solutions of the invention are prepared by first adding deionized water to the plating system, and then adding reagents to the deionized water therein. In this regard, deionized water is added to the plating bath and recirculation system. See 405. An inorganic acid medium is added to the deionized water therein. See 407. Preferably the inorganic acidic medium includes at least one of sulfuric acid, hydrochloric acid, nitric acid, phosphomolybdic acid, perchloric acid, phosphoric acid, methansulfonic acid, and mixtures thereof. An oxidizing medium is added to the deionized water. See 409. Preferably the oxidizing medium includes at least one of hydrogen peroxide, potassium permanganate, chromate salts, ozone, perchlorate salts, persulfate salts, and combinations thereof. Other oxidizing agents can also be used. In a particulary preferred embodiment, the inorganic acid includes between about 1 and 5 weight percent sulfuric acid, and the oxidizing medium includes between about 1 and 5 weight percent of aqueous hydrogen peroxide.

The addition order of the acidic medium and the oxidizing medium may be reversed, or optionally the resultant cleaning solution may be prepared before introduction to the plating apparatus. Once the acidic medium and the oxidizing medium are introduced, the mixture is circulated through the plating bath and any recirculation systems meant for the plating fluid during normal operation. See 411. The mixture is cirulated through the apparatus for a time sufficient to remove all spurious metal deposits, and oxidize any organic contaminants. See 413. After the process time, the mixture is removed from the plating apparatus. See 415. The apparatus is rinsed with deionized water (preferably including circulation through any recirculation systems). See 417. After rinsing, fresh plating fluid is added to the plating apparatus, and the method is done. See 419.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. An electroless plating apparatus for reducing loss of electroless plating components from an electroless plating fluid used during an electroless plating process, the apparatus comprising:

(a) a heat exchange recirculation loop, said heat exchange recirculation loop comprising a heat exchanger and a fluid pump, and an inlet and an outlet of said heat exchange recirculation loop;

(b) an electroless plating vessel recirculation loop configured in fluid communication with said heat exchange recirculation loop, said electroless plating vessel recirculation loop comprising an electroless plating vessel and configured such that the electroless plating fluid enters the electroless plating vessel recirculation loop via the outlet of the heat exchange recirculation loop and exits the electroless plating vessel recirculation loop at the inlet to the heat exchange recirculation loop;

(c) a flow meter configured to measure the flow rate of the electroless plating fluid in the electroless plating vessel recirculation loop; and (d) a flow controller configured to receive flow data input from the flow meter and adjust the amount of the electroless plating fluid that flows through each of the heat exchange recirculation loop and the electroless plating vessel recirculation loop;

wherein the flow controller is configured to maintain the volumetric flow velocity within the heat exchange recirculation loop at a greater value than the volumetric flow velocity within the electroless plating vessel recirculation loop during the electroless plating process.

2. The apparatus of claim 1, wherein the fluid pump is a fixed-speed centrifugal pump.

3. The apparatus of claim 1, wherein the heat exchanger comprises of a mechanism for transferring heat energy to the plating fluid, the mechanism comprising at least one of (a) a resistive element heater, where the plating fluid flows around and/or between the heater element for heat transfer to the plating fluid;

(b) a radiant heater, where the plating fluid flows around and/or between the heater element for heat transfer to the plating fluid; and (c) separate channels, where a heat transfer vapor or liquid or gas is heated and passed through the separate channels for the heat transfer to the plating fluid.

4. The apparatus of claim 1, wherein the electroless plating vessel comprises at least one of:

(a) a bubble separation chamber, configured to remove bubbles from the electroless plating fluid during the electroless plating process;

(b) an airflow control device, configured to control exposure of the electroless plating fluid to air during the electroless plating process; and (c) a ballast tank, configured to receive the electroless plating fluid from a plating chamber of the electroless plating vessel and return the electroless plating fluid to either the heat exchange recirculation loop or the electroless plating vessel recirculation loop the during the electroless plating process.

5. The apparatus of claim 1, wherein the electroless plating vessel further comprises a fluid flow diffuser configured to create a uniform laminar flow of the electroless plating fluid, said uniform laminar flow impinging upon a substantially planar work surface of a workpiece during the electroless plating process.

6. The apparatus of claim 1, wherein the electroless plating vessel further comprises a rinse return duct, configured to receive rinsate from the workpiece during rinse operations.

7. The apparatus of claim 4, wherein the airflow control device is an airflow confinement ring attached to a wafer holder for use in plating wafers in the electroless plating vessel.

8. The apparatus of claim 7, wherein the wafer holder is wafer holder is configured as a clamshell.

9. The apparatus of claim 4, wherein the ballast tank comprises a fluid return slide configured to allow the electroless plating fluid to enter the ballast tank along a slope and thereby minimize agitation of the electroless plating fluid during return to the ballast tank.

10. The apparatus of claim 1, wherein the flow meter is used to control the flow through the plating vessel recirculation loop.

11. The apparatus of claim 1, wherein the flow controller regulates the plating fluid to the plating cell, and the heat exchange recirculation loop.

12. The apparatus of claim 7, wherein the airflow confinement ring is configured to limit the amount of air to flow over the electroless plating fluid during any stage of the electroless plating process, while directing vapors generated from the plating fluid into a contained exhaust, and not allowed to escape from the plating cell area.

13. The apparatus of claim 6, wherein the rinse return duct also serves as an airflow exhaust port.

14. The apparatus of claim 13, wherein the rinse return duct feeds rinsate and exhaust air into an air and rinsate drain manifold configured to feed air and rinsate into separate waste streams.

15. The apparatus of claim 13, wherein the rinse return duct further comprises an airflow exhaust control distributor configured to maintain a substantially even flow distribution in the total airflow within the electroless plating vessel during the electroless plating process.

16. An electroless plating vessel comprising:

(a) a bubble separation chamber, configured to remove bubbles from an electroless plating fluid during an electroless plating process;

(b) an airflow control device, configured to control exposure of the electroless plating fluid to air during the electroless plating process; and (c) a ballast tank, configured to receive the electroless plating fluid from a plating chamber of the electroless plating vessel and return the electroless plating fluid to a recirculation loop of an electroless plating apparatus during the electroless plating process, said electroless plating apparatus comprising the electroless plating vessel.

17. The electroless plating vessel of claim 16, further comprising a fluid flow diffuser configured to create a uniform laminar flow of the electroless plating fluid, said uniform laminar flow impinging upon a substantially planar work surface of a workpiece during the electroless plating process.

18. The electroless plating vessel of claim 16, further comprising a rinse return duct, configured to receive rinsate from the workpiece during rinse operations.

19. The electroless plating vessel of claim 16, wherein the airflow control device is an airflow confinement ring attached to a wafer holder used to plate wafers in the electroless plating vessel.

20. The electroless plating vessel of claim 19, wherein the wafer holder is configured as a clamshell.

21. The electroless plating vessel of claim 19, wherein the airflow confinement ring comprises of a mechanism for restricting air into the electroless plating vessel and over the electroless plating fluid, while maintaining clearance for wafer movement.

22. The electroless plating vessel of claim 16, wherein the ballast tank comprises a fluid return slide configured to allow the electroless plating fluid to enter the ballast tank along a slope and thereby minimize agitation of the electroless plating fluid during return to the ballast tank.

23. The electroless plating vessel of claim 19, wherein the airflow confinement ring is configured to limit the volume of air passing over the electroless plating fluid during any stage of the electroless plating process.

24. The electroless plating vessel of claim 18, wherein the rinse return duct also serves as an airflow exhaust port.

25. The electroless plating vessel of claim 24, wherein the rinse return duct feeds rinsate and exhaust air into an air and rinsate drain manifold configured to feed air and rinsate into separate waste streams.

26. The electroless plating vessel of claim 24, wherein the rinse return duct further comprises an airflow exhaust control distributor configured to maintain a substantially even airflow distribution along the wall of the plating vessel during any stage of the electroless plating process and to minimize the amount of airflow passing over the electroless plating fluid.

27. The electroless plating vessel of claim 16, wherein the ballast tank volume is sufficient to contain plating overflow liquid produced when the wafer holder is placed into the plating cell.

28. A method of reducing the total head load of an electroless plating fluid during a plating process, the method comprising:
    (a) circulating the electroless plating fluid through a heat exchange recirculation loop at a first volumetric flow velocity, said heat exchange recirculation loop comprising a heat exchanger and a fluid pump, an inlet and an outlet of said heat exchange recirculation loop configured in fluid communication with an electroless plating vessel recirculation loop; and
    (b) circulating the electroless plating fluid through said electroless plating vessel recirculation loop at a second volumetric flow velocity, said electroless plating vessel recirculation loop comprising an electroless plating vessel and configured such that the electroless plating fluid enters the electroless plating vessel recirculation loop via the outlet of the beat exchange recirculation loop and exits the electroless plating vessel recirculation loop via the inlet of the heat exchange recirculation loop;

wherein the first volumetric flow velocity is greater than the second volumetric flow velocity.

29. The method of claim 28, wherein the fluid pump is a fixed-speed centrifugal pump.

30. The method of claim 28, wherein the first volumetric flow velocity is between about 2 and 12 lpm, and the second volumetric flow velocity is between about 2 and 6 lpm.

31. The method of claim 28, further comprising controlling the amount of evaporation of the electroless plating fluid during plating.

32. The method of claim 31, wherein evaporation of the electroless plating fluid from the electroless plating vessel is controlled by minimizing the airflow to which the electroless plating fluid in the electroless plating vessel is exposed.

33. The method of claim 32, wherein minimizing the airflow to which the electroless plating fluid is exposed comprises use of an airflow confinement ring, said airflow confinement ring attached to a wafer holder and configured to provide, in conjunction with an inner surface of the electroless plating vessel, a peripheral air channel through which air flows during the plating process.

34. A method of removing metal deposits from surfaces of a wafer plating apparatus, the method comprising:
    (a) removing a plating solution from the wafer plating apparatus;
    (b) providing an inorganic acidic medium to the wafer plating apparatus;
    (c) providing an oxidizing medium to the wafer plating apparatus;
    (d) circulating the inorganic acidic medium and the oxidizing medium through the wafer plating apparatus; and
    (e) removing the inorganic acidic medium and the oxidizing medium from the wafer plating apparatus.

35. The method of claim 34, wherein the inorganic acidic medium comprises between about 1 and 5 weight percent sulfuric acid.

36. The method of claim 34, wherein the oxidizing medium comprises between about 1 and 5 weight percent of aqueous hydrogen peroxide.

37. The method of claim 34, wherein the wafer plating apparatus is rinsed with deionized water after (a) and before (b).

38. The method of claim 34, further comprising rinsing the wafer plating apparatus with deionized water after removing the inorganic acidic medium and the oxidizing medium from the wafer plating apparatus.

39. The method of claim 34, further comprising rinsing the wafer plating apparatus with deionized water prior to (a)–(e).

40. The method of claim 34, wherein the plating bath is provided with deionized water after (a) and prior to both (b) and (c).

41. The method of claim 34, wherein the inorganic acidic medium comprises at least one of sulfuric acid, hydrochloric acid, nitric acid, phosphomolybdic acid, perchloric acid, phosphoric acid, methansulfonic acid, and mixtures thereof.

42. The method of claim 34, wherein the oxidizing medium comprises at least one of hydrogen peroxide, potassium permanganate, chromate salts, ozone, perchlorate salts, persulfate salts, and mixtures thereof.

* * * * *